United States Patent
Draxelmayr

(10) Patent No.: US 11,196,437 B1
(45) Date of Patent: Dec. 7, 2021

(54) SYSTEM AND METHOD FOR TESTING AN ANALOG-TO-DIGITAL CONVERTER

(71) Applicant: Infineon Technologies AG, Neubiberg (DE)

(72) Inventor: Dieter Draxelmayr, Villach (AT)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

(21) Appl. No.: 17/108,624

(22) Filed: Dec. 1, 2020

(51) Int. Cl.
*H03M 1/10* (2006.01)

(52) U.S. Cl.
CPC ....... *H03M 1/1071* (2013.01); *H03M 1/1009* (2013.01)

(58) Field of Classification Search
CPC .......................... H03M 1/1071; H03M 1/1009
USPC .......................................................... 341/120
See application file for complete search history.

(56) References Cited

U.S. PATENT DOCUMENTS

| 4,970,514 | A | 11/1990 | Draxelmayr | |
|---|---|---|---|---|
| 6,476,741 | B1* | 11/2002 | Cherubal | H03M 1/109 341/120 |
| 9,106,247 | B2* | 8/2015 | Hamilton | H03M 1/1071 |

OTHER PUBLICATIONS

Goyal, Shalabh et al., "Linearity Testing of A/D Converters Using Selective Code Measurement", ResearchGate, https://www.researchgate.net/publication/220648433, Dec. 2008, 9 pages.

Kester, Walt et al., "Chapter 5 Testing Data Converters Section 5.1: Testing DACs", Testing Data Converters 5.1 Testing DACs, Static DAC Testing, 2004, 94 pages.

* cited by examiner

*Primary Examiner* — Khai M Nguyen
(74) *Attorney, Agent, or Firm* — Slater Matsil, LLP

(57) ABSTRACT

In accordance with an embodiment, a method for operating an analog-to-digital converter (ADC) includes: determining a trip point of a comparator of the ADC by applying a first signal having a first slope to an input of the ADC, and monitoring an output state of the comparator in response to the first signal; and after applying the first signal, applying a second signal having a second signal level based on the determined trip point of the comparator, monitoring values of an output code of the ADC in response to the second signal, and generating statistical information based on the monitored values of the output code, where the second signal is a static signal or has as second slope less than the first slope.

30 Claims, 10 Drawing Sheets

IH = DIRECTION*ENABLE($I_{SMALL}$*SLOPE_B + $I_{LARGE}$*SLOPE)
IL = DIRECTION_B*ENABLE($I_{SMALL}$*SLOPE_B + $I_{LARGE}$*SLOPE)

SYSTEM AND METHOD FOR TESTING AN ANALOG-TO-DIGITAL CONVERTER

TECHNICAL FIELD

The present invention relates generally to electronic systems, and, in particular embodiments, to a system and method for testing an analog-to-digital converter (ADC).

BACKGROUND

Analog-to-Digital converters are used to convert real-world analog signals into the digital domain for many types of systems ranging from low frequency systems that process the output of pressure sensors and microphones to high frequency systems such as RF and radar systems that process received RF signals. Many such systems rely on high performance ADCs in order to meet important design specifications. One important performance parameter of an ADC is linearity, which is a measure of how much the transfer function of the ADC deviates from an ideal transfer function. ADC non-linearity can be quantified in a number of different ways including, for example, differential non-linearity (DNL), integral nonlinearity (INL) and spurious free dynamic range (SFDR). DNL describes the deviation of a particular code width with respect to its ideal code width of one LSB. As the DNL of a particular code becomes −1 (e.g. the width of the code becomes zero), missing codes results. As the DNL of a particular code exceeds 1, the ADC transfer function may become non-monotonic, which can be problematic in systems such as control systems that require monotonic ADCs. DNL may also manifest itself as "stuck" output codes. INL describes the deviation an ADC of a particular code with respect to its ideal output code assuming an ideal transfer function and correction for gain and offset errors, and is indicative of the degree to which the transfer function of the ADC deviates from a straight line. Both DNL and INL is expressed in terms of the number of least significant bits (LSBs) of deviation from their ideal value.

SFDR is a measure of linearity expressed in the frequency domain, and is the difference in amplitude between a desired input signal and the largest spur. SFDR is a useful metric for systems in which distortion is an important parameter, for example, in audio systems and in RF receivers. The existence of spurs in an RF communication system may degrade the ability of an RF receiver from demodulating a signal in the presence of adjacent interfering signals. In radar systems, the existence of spurs may lead to the production of "ghost targets," and may cause the radar system to indicate the existence of targets or obstacles when none, in fact, exists. Dynamic range can also be characterized in terms of dBFS, which is the difference in amplitude between the full-scale input of the ADC and the largest spur.

There are a number of different error mechanisms within an ADC that cause non-linearities. For ADCs having a pipelined architecture or a successive approximation architecture, mismatch in component values and offset values for the circuitry used to determine the most significant bits of the ADC result are often dominant sources of non-linearity. A number of techniques may be used to mitigate such non-linearity including applying known device matching techniques and error correction though redundancy. Calibration techniques can also be used to improve the linearity of the ADC; however, the linearity performance of a calibrated ADC may degrade over time as the device parameters shift due to changes in voltage, temperature and other environmental factors.

SUMMARY

In accordance with an embodiment, a method for operating an analog-to-digital converter (ADC) includes: determining a trip point of a comparator of the ADC by applying a first signal having a first slope to an input of the ADC, and monitoring an output state of the comparator in response to the first signal; and after applying the first signal, applying a second signal having a second signal level based on the determined trip point of the comparator, monitoring values of an output code of the ADC in response to the second signal, and generating statistical information based on the monitored values of the output code, where the second signal is a static signal or has as second slope less than the first slope.

In accordance with another embodiment, an integrated circuit includes: an analog-to-digital converter (ADC) including at least one comparator disposed on the integrated circuit; a test signal generator disposed on the integrated circuit and having an output selectably coupled to an input of the ADC, the test signal generator configured to produce a ramp signal; and a test controller coupled to an output of the at least one comparator and the test signal generator, the test controller configured to: cause the test signal generator to produce a first ramp signal having a first slope, the first ramp signal causing an output state of the at least one comparator to change at a comparator trip point; cause the test signal generator to produce a second ramp signal having a second slope less than the first slope, where the second ramp signal alternatingly increases and decreases between a first upper level and a second lower level, where the comparator trip point is between the first upper level and second lower level; and evaluating occurrences of individual output codes of the ADC.

In accordance with a further embodiment, an integrated circuit includes: an analog-to-digital converter (ADC) including at least one comparator disposed on the integrated circuit; a test signal generator having an output coupled to an input to an ADC; and a test controller having an output coupled to the test signal generator, a first input coupled to an output of a comparator of the ADC, and a second input configured to receive an output code of the ADC, where the test controller is configured to determine a trip point of the comparator by causing the test signal generator to apply a first signal having a first slope to an input of the ADC, and monitoring an output state of the comparator in response to the first signal, and cause the test signal generator to apply a second signal having a signal level based on the determined trip point of the comparator, and comparing an accumulation or average of values of codes resulting from first decisions of the comparator with an accumulation or average of values of codes resulting from second decisions of the comparator, where the second signal is a static signal or has as second slope less than the first slope.

BRIEF DESCRIPTION OF THE DRAWINGS

For a more complete understanding of the present invention, and the advantages thereof, reference is now made to the following descriptions taken in conjunction with the accompanying drawings, in which.

Figure 1A:
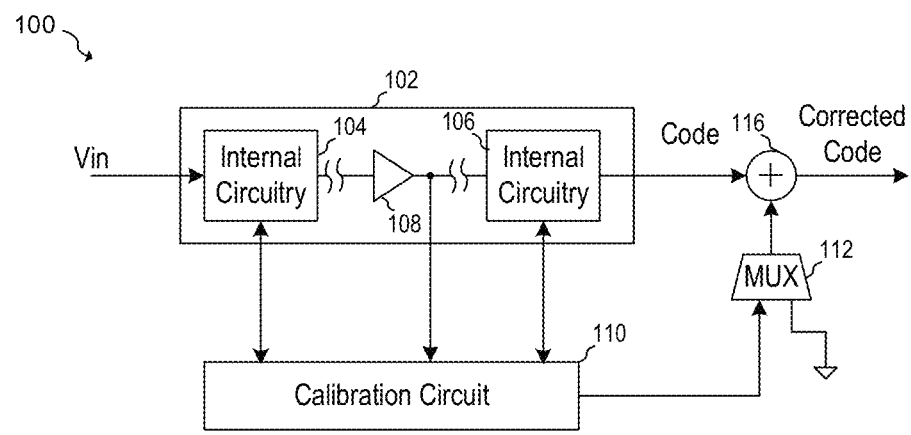
FIG. 1A illustrates an exemplary ADC system.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in the specific context of an on-chip calibration system for a pipelined ADC or a successive approximation (SAR) ADC. The invention, however, can be used to provide calibration testing and linearity verification for other types of systems that utilize data converters, and may be used to test data converters of various architectures.

In accordance with an embodiment of the present invention, a method of testing the linearity of an ADC includes applying a test signal having a high slope (e.g. voltage change $\Delta V$ over time interval $\Delta t$) until the state of an internal comparator of the ADC changes state. This internal comparator may be associated with a decision threshold within the ADC that directly affects the linearity of the ADC. Once the decision threshold has been determined, the slope of the test signal is reduced (or made zero) such that the input voltage of the ADC is within an input range representing a limited number of ADC output codes. In some embodiments, a ramp signal of alternatingly increasing and decreasing voltage is applied to the input of the ADC such that input voltage of the ADC remains close to the trip point of the internal comparator. The ADC output codes and/or the output state of the comparator are monitored and a linearity metric is determined based on the output codes and/or the monitored comparator state. In some embodiments, a histogram of the ADC output codes is derived with respect to the monitored output states of the comparator to derive the linearity metric. In some embodiments, this linearity metric is the difference in average ADC output code when the comparator is in a first state (e.g. high) and in a second state (e.g. low).

Advantageously, by applying an initial fast ramp to the input of the ADC, the trip point of the internal comparator can be quickly found. By analyzing the output codes of the ADC over a limited input range, a linearity metric may be derived using a very small amount of circuitry. A further advantage of embodiments includes the ability to use a very simple ramp generator to generate the test signal without requiring the use of an accurate digital-to-analog converter. A further advantage includes the ability to quickly test and evaluate the linearity of ADC's that utilizes error correction through redundancy.

In various embodiments, test circuitry may be used in combination with calibration circuitry such as foreground calibration circuitry. In such embodiments, a linearity test of the ADC linearity may be performed periodically to ensure that the linearity of the ADC is within a specified range. When the measured linearity drifts away from the predefined range, the ADC can be recalibrated.

FIG. 1A illustrates a block diagram of an exemplary ADC system 100 that includes an ADC 102 interfaced with calibration circuit no. ADC 102 is configured to convert a signal Vin present at the input to ADC 102 into a digital signal Code. Calibration circuit no calibrates ADC 102 by determining a code correction factor that is applied to the output of ADC 102 via multiplexer 112 and summer 116 to provide a corrected code.

As shown, ADC 102 includes internal circuitry 104 and 106 and a comparator 108. Internal circuitry 104 and 106 is representative of the various circuitry that can be found in ADCs, and comparator 108 represents a comparator or other circuit configured to apply a decision threshold to analog input signal Vin, or any analog signal internal to ADC 102. Operation of ADC 102 occurs in two phases: a calibration phase and an operational phase. During the calibration phase, calibration circuit no applies known analog signals to ADC 102 or to internal nodes of ADC 102 while monitoring the operation of ADC 102 in order to determine instances where the actual code of ADC 102 deviates from an ideal output code, and to determine correction values that improve the linearity and accuracy of ADC 102.

Figure 1B:
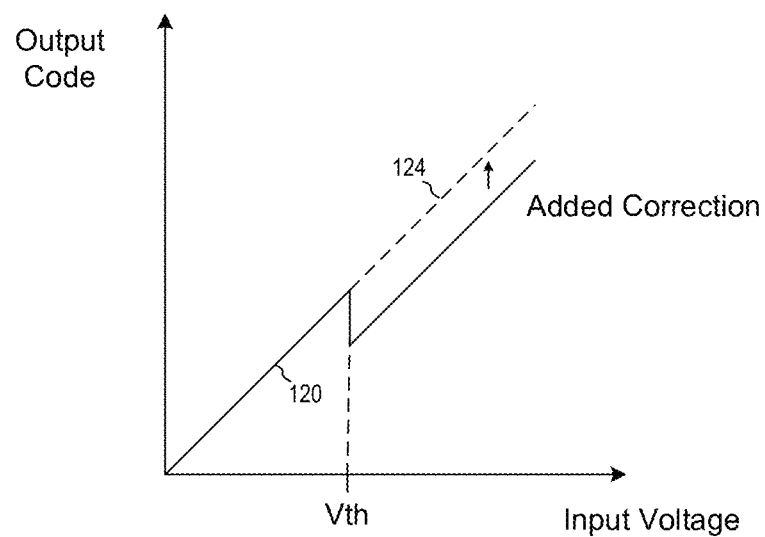
FIG. 1B illustrates an exemplary ADC transfer curve.

FIG. 1B illustrates a graph of output code with respect to input voltage Vin for ADC 102. Curve 120 represents the uncorrected ADC output code with respect to input voltage, and curve 124 represents the corrected ADC output code with respect to input voltage. As is apparent from the graph, there is a discontinuity or "jump" of curve 120 at input voltage Vth, which represents the threshold of comparator 108. This discontinuity may be caused by mismatched circuit components within internal circuits 104 and 106 of ADC 102, and/or by a shift in ideal threshold voltage Vth of a comparator. For example, in ADC architectures that utilize one or more DACs to make successive estimations of the input voltage, such as an SAR ADC or a pipelined ADC, mismatch in the circuit elements used to determine the output voltage or output current of the DAC may cause nonlinearities or "jumps" in the relationship between input signal and output code similar to curve 120 in FIG. 1B. By providing a correction factor that is summed with the uncorrected ADC output, calibration circuit no effectively shifts a portion of curve 120 upward to curve 124 to reduce or eliminate the "jumps" or nonlinearities in the ADC transfer function. It should be understood that while only one jump or nonlinearity is depicted in FIG. 1B for the sake of clarity, the transfer function of ADC 102 may have a plurality of jumps or nonlinearities. Such nonlinearities may cause increased DNL and INL and may reduce the SFDR of a particular converter. In many cases, these nonlinearities correspond to major code transitions of the ADC, such as those code transitions associated with a change of state of the most significant bit or the next most significant bit of the ADC output code.

While calibration circuit no may improve the linearity of ADC 102, some residual non-linearities may remain after calibration. Moreover, the quality of the calibration may fluctuate due to statistical fluctuations that occur during the calibration phase, or may shift due to changes in power supply voltage, temperature, and environmental conditions. As such, some calibration cycles may or may not produce a calibration whose resulting ADC performance meets predetermined performance requirements. For example, some calibrations may produce residual nonlinearities or jumps that are sufficiently small enough and/or distributed in a manner that allows to meet linearity requirements (such as SFDR) that is suitable for a particular application, while other calibrations may produce residual nonlinearities or jumps that are too large and/or are distributed in a manner that causes inadequate ADC performance. In some cases, the quality of the calibration may drift during use after the ADC is manufactured and calibrated.

Figure 2A:
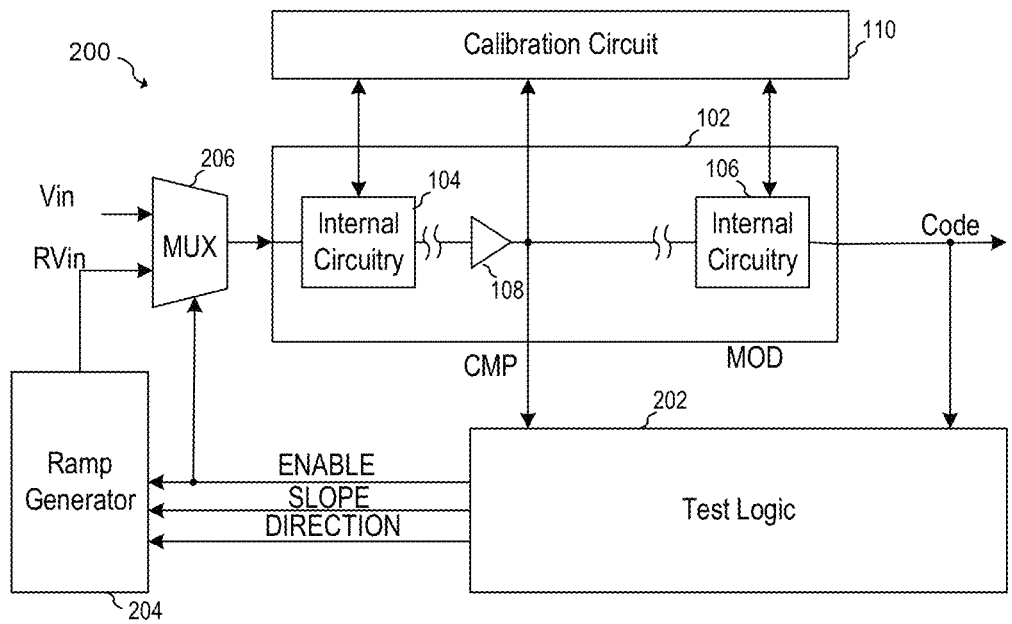
FIG. 2A illustrates an ADC according to an embodiment.

In various embodiments of the present invention, the linearity of an ADC can be quickly measured and assessed after manufacture. In some embodiments, linearity testing is performed by dedicated test circuitry that is resident within the ADC system. In some cases, the dedicated test circuitry is disposed on the same chip or monolithic semiconductor substrate as the ADC. An example of such a system is shown in FIG. 2A, which illustrates ADC system 200 that includes ADC 102 coupled to test logic 202, ramp generator 204 and multiplexer 206. During normal operation, input signal Vin is coupled to the input of ADC 102 via multiplexer 206. In some embodiments, the output code of 102 is corrected using a calibration circuit no as discussed above with respect to FIG. 1A. Calibration may be achieved using one of many calibration circuits and systems known in the art. For example, a foreground calibration circuit may be used to measure the relative weight of each bit or the relative weighting of various components within the ADC as they relate to a raw output of the ADC. Once these relative weights are determined, the output code is adjusted as a function of the determined weights. One example of a foreground calibration circuit is described in U.S. Pat. No. 4,970,514. Alternatively, other calibration methods could be applied to embodiments described herein. For example, embodiment methods could be used to test and verify ADCs that have been trimmed or background calibrated. The linearity of an uncorrected and/or uncalibrated ADC could also be evaluated according to embodiment systems and methods.

During linearity testing, test logic 202 asserts signal ENABLE to activate ramp generator and to couple the output RVin of ramp generator 204 to the input of ADC 102 via multiplexer 206. Ramp generator 204 is configured to provide a ramp signal that includes at least one ramp in one direction. Using control signals SLOPE and DIRECTION, test logic 202 configures ramp generator to increase the signal level at the input of ADC 102 with a first linear slope until output CMP of comparator 108 changes state in order to set the output of ramp generator 204 to a signal level that is in close proximity to an input level corresponding to the threshold of comparator 108. Next, test logic causes ramp generator 204 to provide a test signal having a smaller, second linear slope with a reduced input range that varies in the vicinity of the input level that corresponds to the threshold of comparator 108. For example, when signal SLOPE is in a first state (e.g. logic "1"), the ramp generator produces the faster, first linear slope, and when signal SLOPE is in a second state (e.g. logic "0") ramp generator produces the slower, second linear slope. When signal DIRECTION is in a first state (e.g. logic "1"), the ramp generator produces a ramp having a linearly increasing signal level, and when signal DIRECTION is in a second state (e.g. logic "0"), the ramp generator produces a ramp having a linearly decreasing signal level. It should be appreciated that in alternative embodiments of the present invention other types of test signal generators besides ramp generator 204 that generate linear ramp signals could be used in alternative embodiments to test the linearity of ADC 102. For example, test generators that produce more than two ramp speeds and/or produce ramps that are not strictly linear may be used.

During testing, test logic 202 monitors the code output of ADC 102 to evaluate the linearity of ADC 102 in a small code range associated with the input level corresponding to the threshold of comparator 108. In some examples, the test logic 202 in addition also monitors the output CMP of comparator 108. In some embodiments, this linearity is evaluated by compiling a local histogram of the output codes of ADC 102 and or output code values with respect to the measured state of comparator output signal CMP. Parameters of the compiled histogram or categorized codes are compared to stored parameters, and a determination of the linearity of the ADC is made according to this comparison. In some embodiments, a first set of ADC output codes associated with a first measured state of comparator output signal CMP are accumulated or averaged, and a second set of ADC output codes corresponding to a second measured state of comparator output signal CMP are measured or averaged. A difference between the two accumulated values or averages is compared to a predetermined range or to a predetermined threshold in order to determine an ADC performance metric. If the determined ADC performance metric is within the predetermined range or within the predetermined threshold, the linearity of the ADC is deemed to be within an acceptable range. If the determined ADC performance metric is outside of the predetermined range of above the threshold, corrective action, such as performing a calibration to improve the linearity of the ADC, may be taken. In various embodiments, a linearity test is periodically performed, for example, at predefined time intervals and/or after predetermined temperature changes, to verify the performance of ADC 102.

In some embodiments linearity testing is performed after performing a foreground calibration in order to verify the calibration's effectiveness. Either a foreground calibration or a linearity test may be performed or scheduled at times during which the ADC does not have a signal load and would otherwise be idle. In some embodiments, linearity tests may be run on a periodic basis to provide an ongoing verification of the performance of ADC 102. When a linearity test indicates that ADC 102 is out of calibration (e.g. if the determined ADC performance metric determined by the linearity test is not within a predetermined range or within a predetermined threshold), ADC 102 may be recalibrated and followed by a further linearity test. If the further linearity test indicates that the ADC performance metric is within the predetermined range or threshold, then ADC operation proceeds with the new calibration. On the other hand, if the further linearity test indicates that the ADC performance metric for the new calibration is not within the predetermined range or threshold and/or indicates that the ADC performance metric associated with the new calibration is worse than the ADC performance metric associated with the previous calibration, the calibration state of ADC 102 may revert back to its previous calibration state. The above sequence may be repeated multiple times in order to achieve calibration of the ADC 102.

In some embodiments, calibration circuit no produces calibration data associated with its calibration state. This calibration data may represent relevant calibration values. For example, the calibration data may represent bit weights that are applied to the results of comparator 108 and other internal comparison circuitry, component trim settings, or any other calibration variables. In the case where a second calibration attempt is deemed to be inferior to a first calibration (linearity test results do not meet predefined criteria), the data associated with the first calibration may be reloaded into calibration registers of ADC 102 and/or calibration circuit no.

Figure 2B:
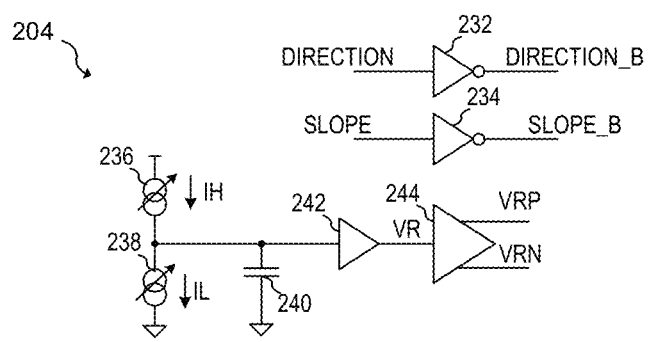
FIG. 2B illustrates a schematic of a ramp generator according to an embodiment.

FIG. 2B illustrates a schematic of an embodiment ramp generator that may be used to implement ramp generator 204 shown in FIG. 2A. As shown, ramp generator 204 includes a high-side current source 236, a low-side current source 238, a capacitor 240, a buffer amplifier 242, an optional single-ended to differential converter 244, and inverters 232 and 234.

During operation, an increasing ramp is produced by charging capacitor 240 with current IH produced by high-side current source 236, and a decreasing ramp is produced by discharging capacitor 240 with current IL produced by low-side current source 238. The slope of the ramp is determined by the amplitude of the currents produced by current sources 238 and 240, such that higher slopes correspond with higher currents, and lower slopes correspond with lower currents. The voltage across capacitor 240 is buffered by buffer amplifier 242. In embodiments in which ADC 102 has a differential input stage, optional single-ended to differential converter 244 may be used to convert singled ended ramp signal at node VR to a fully differential signal at nodes VRP and VRN. As shown, the amplitude of each current source may be controlled by signals DIRECTION, ENABLE and SLOPE produced by test logic 202. In one embodiment, currents IH and IL are set as follows:

$IH=\text{DIRECTION}*\text{ENABLE}(I_{SMALL}*\text{SLOPE\_}B+I_{LARGE}*\text{SLOPE})$ $IL=\text{DIRECTION\_}B*\text{ENABLE}(I_{SMALL}*\text{SLOPE\_}B+I_{LARGE}*\text{SLOPE})$, where DIRECTION_B is the logical inverse of signal DIRECTION produced by inverter 232, SLOPE_B is the logical inverse of signal SLOPE produced by inverter 234, $I_{LARGE}$ is the current corresponding to the faster, first slope, and $I_{SMALL}$ is the magnitude of the current corresponding to the slower second slope.

In various embodiments, current sources 236 and 238 may be implemented, for example, using current mirror circuits known in the art; buffer amplifier 242 may be implemented using, for example, a source follower; and single-ended to differential amplifier 244 may be implemented using single-ended to differential amplifier circuits known in the art. It should be appreciated that the circuit of FIG. 2B is just one example of the many possible ways that embodiment ramp generators could be implemented. In alternative embodiments of the present invention, different circuitry could be used to implement the same or similar functions.

Figure 3A:
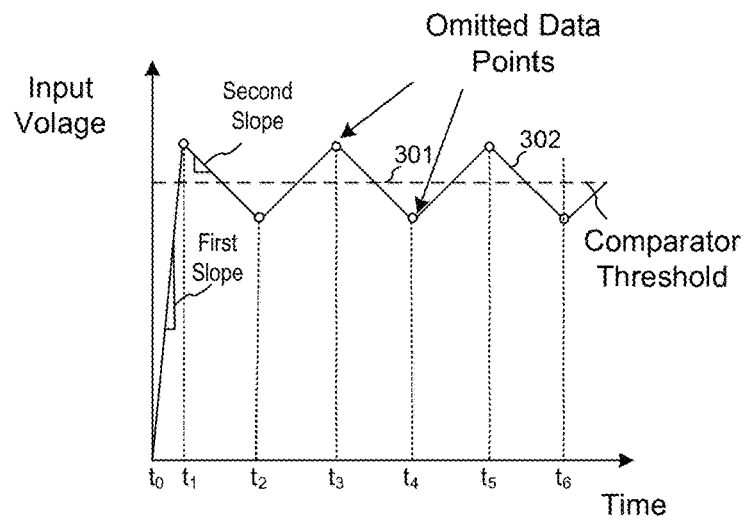
FIGS. 3A, 3B and 3C illustrate waveform diagrams showing example voltage profiles produced by an embodiment ramp generator.
Figure 3B:
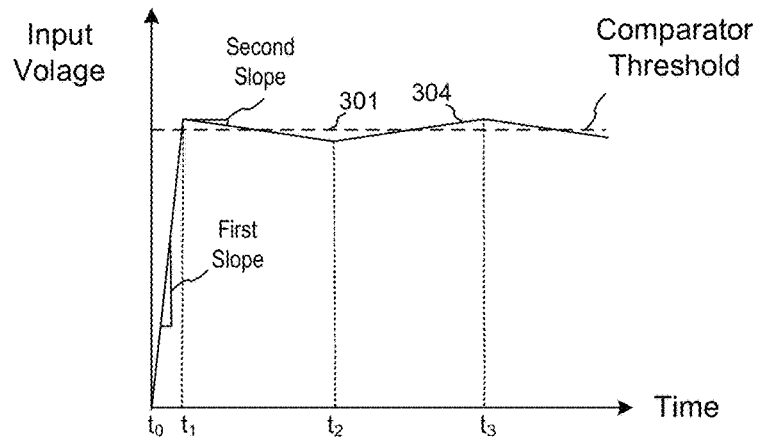
Figure 3C:
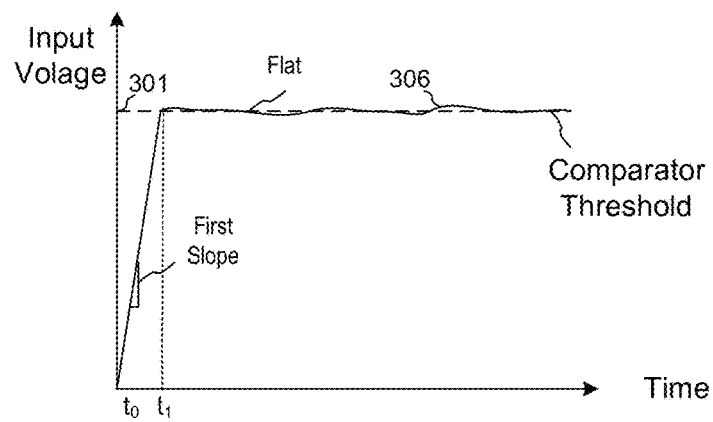

FIGS. 3A-3C illustrate waveform diagrams showing example voltage profiles produced by ramp generator 204 during embodiment linearity tests. FIG. 3A illustrates a first voltage profile in which trace 302 represents the output voltage of ramp generator 204 and the input voltage of the ADC under test. From time $t_0$ to time $t_1$, the output voltage of ramp generator 204 increases at a first slope. During this time period, the threshold 301 (also referred to as a trip-point) of comparator 108 is exceeded. This threshold is represented as a dashed line 301 as it corresponds with the output voltage of ramp generator 204 for simplicity of illustration. However, it should be understood that both of the input voltage of the ADC 102 and the comparator threshold may be attenuated or amplified by internal ADC circuits 104 as the input signal propagates through the circuitry of ADC 102. At time $t_1$, the trajectory of trace 302 reverses direction from increasing to decreasing, and the slope of trace 302 is reduced to a second slope having an absolute value less than the first slope. The value of trace 302 continues to decrease until time $t_2$ when the trajectory of trace 302 reverses direction and increases at the second slope. At times $t_3$, $t_4$, $t_5$ and $t_6$, trace 302 alternatingly changes direction between a decreasing signal level and an increasing signal level at the second slope. Thus, second ramp signal represented by trace 302 alternatingly increases and decreases between a first upper level and a second lower level. In some embodiments, the slope of the increasing ramp and the decreasing ramp of the second ramp signal may have different values lower than the first slope in a manner in which the resulting code distribution remains the same. For example, two different slope low1 and low2 could be used to achieve the same amplitude (e.g. the first upper level and the same lower level). These multiple slopes could be applied in a sequenced fashion using various combinations. In one specific example, the decreasing slopes could alternate in slope (e.g. six decreasing slopes using slope low1 followed by six decreasing slopes using slope low2) and the increasing slopes could alternate in slope (e.g. six decreasing slopes using slope low1 followed by six decreasing slopes using slope low2). In some embodiments the second slope may also change over time. In various embodiments, test logic 202 in conjunction with ramp generator 204 controls the direction of trace 302 by monitoring the output of comparator 108 and/or the output code of ADC 102, and changing the direction of the ramp produced by ramp generator 204 when the output of comparator 108 changes state and/or after the output of ADC 102 passes a threshold. In some embodiments, hysteresis is applied while monitoring the output of ADC 102. For example, the direction of the ramp may be changed from increasing to decreasing when the output of ADC 102 passes a first threshold corresponding to the threshold of comparator 108 offset by a positive value, while the direction of the ramp may be changed from decreasing to increasing when the output of ADC 102 passes a second threshold corresponding to the threshold of comparator 108 offset by a negative value. In some embodiments, about 20 to 40 LSBs of hysteresis is applied, although greater or lesser amounts of hysteresis could be applied in alternative embodiments.

Starting at time $t_1$, the output code of ADC 102 is monitored and analyzed by test logic 202 to determine the linearity of ADC 102 in the vicinity of the threshold of comparator 108. The linearity may be determined, for example, by constructing a histogram of the monitored codes, and analyzing the code density of the output codes while the second slope is applied to ADC 102. In some embodiments, the peak regions of 302 may deviate from the ideal triangular trajectory illustrated in FIG. 3A due to limited bandwidth and other non-idealities. These deviations from the ideal triangular shape may affect the observed code density for codes corresponding to these peak regions. Thus, in some embodiments, output values of ADC 102 corresponding to regions of maximum and minimum excursions or upper signal levels or lower signal levels of trace 302 are omitted or discarded when determining the linearity of ADC 102 in order to retain only codes that are undisturbed by these "edge effects" that occur when the slope of the waveform generated by ramp generator 204 changes direction.

FIG. 3B illustrates a second voltage profile in which trace 304 represents the output voltage of ramp generator 204 and the input voltage of the ADC under test. The generation of the second voltage profile is similar to the generation of the first voltage profile discussed above with respect to FIG. 3A, with the exception that the voltage excursion about the comparator trip point is smaller than the 20 to 40 LSBs of variation described above. This smaller voltage excursion may be varied, for example, by reducing the magnitude of the second slope and/or by decreasing the amount of hysteresis used to when changing the polarity of the ramp in comparison to generating the ramp illustrated in FIG. 3A.

In some embodiments, the peak-to-peak variation of trace 304 about the comparator trip point is a few LSBs. In such embodiments, test logic 202 may be configured to evaluate the linearity of ADC 102 in the region of the threshold of comparator 108 by comparing an average of the output code of ADC 102 computed when comparator 108 is in a first state (e.g. the output of comparator 108 is "1"), to an average of the output code of ADC 102 when comparator 108 is in a second state (e.g. the output of comparator 108 is "1"). In other embodiments, codes are recorded for averaging only when the output of comparator 108 transitions from a first state to a second state (e.g. from "1" to "0" or from "0" to "1"). Recording and evaluating output ADC codes in this manner ensures that that the evaluated ADC codes closely correspond to the threshold of comparator 108, and that effects associated with the moving input signal are reduced or eliminated.

In some embodiments, the output of ramp generator 204 is held constant after the first slope is applied, as shown in FIG. 3C with respect to trace 306. As shown, the first slope is applied starting at time $t_0$ until the comparator trip point is reached at time $t_1$, at which time the output of ramp generator 204 is frozen at the trip point of comparator 108. Freezing the output out ramp generator 204 may be performed, for example, by turning off current source s 236 and 238 shown in FIG. 2B to prevent capacitor 240 from being charged or discharged. Alternatively, a DAC (not shown) could be used to produce the static input signal. In other embodiments, the input signal level can be set in a closed loop manner by monitoring the output code of ADC 102 and setting modifying the input signal via ramp generator 204, a DAC (not shown), or other signal generator until the input voltage corresponds to a desired ADC output code value.

The linearity of ADC 102 can be evaluated in a similar manner as the embodiment of FIG. 3B, for example by comparing average values of the ADC output that are associated with particular states and/or state transitions of comparator 108.

In some embodiments, the decision of comparator 108 may be biased by input noise present in the input signal to ADC 102. Normally, it would be assumed that if a noisy, static, input signal nominally were sitting exactly at the trip point of the comparator, 50% of the comparator decisions would be low and 50% of the comparator decisions would be high. However, when high comparator decisions are caused by voltages temporarily increased by noise and low comparator decisions are caused by voltages temporarily decreased by noise, the averaged ADC output codes caused by high decisions will be higher than the averaged ADC output codes caused by low decisions. For example, a Gaussian input noise signal of 600 µV could cause comparator 108 to have an offset of about 1 mV. Thus, the embodiment ramp trajectory of FIG. 3C (e.g. freezing the output of ramp generator 204) may be suitable for embodiments in which the decisions of comparator 108 are less prone to input noise bias. On the other hand, the embodiment ramp trajectories of FIGS. 3A and 3B may be more suitable for embodiment ADCs in which the decisions of comparator 108 are more prone to bias due to input noise due to the ability of the ramped signal to decorrelate comparator decisions from the input noise. Decorrelation may be also effected, for example, by designing comparator 108 to have sufficiently high input referred noise.

Figure 4A:
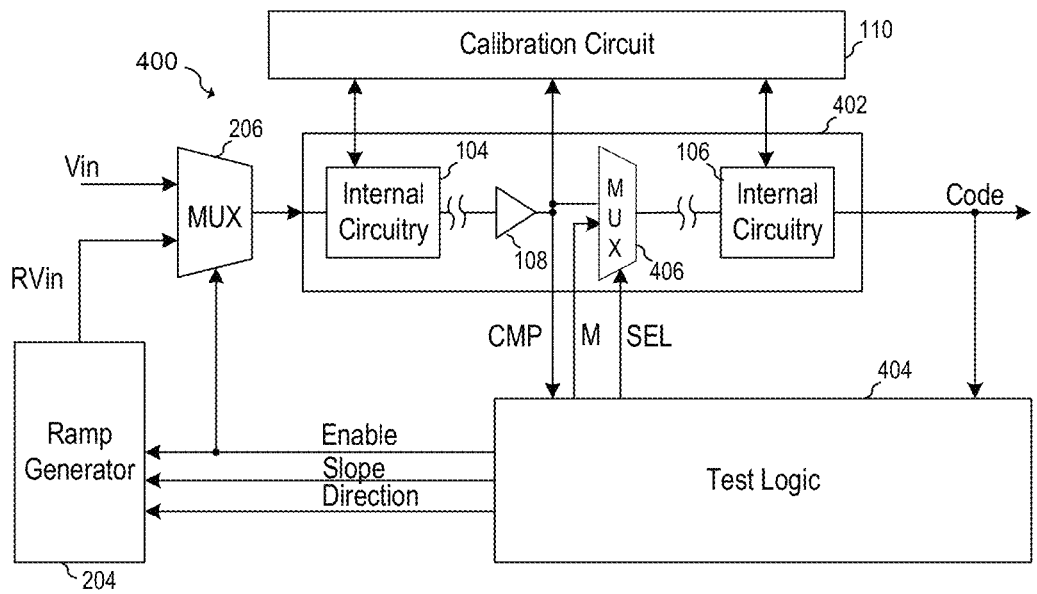
FIG. 4A illustrates an ADC according to a further embodiment.
Figure 4B:
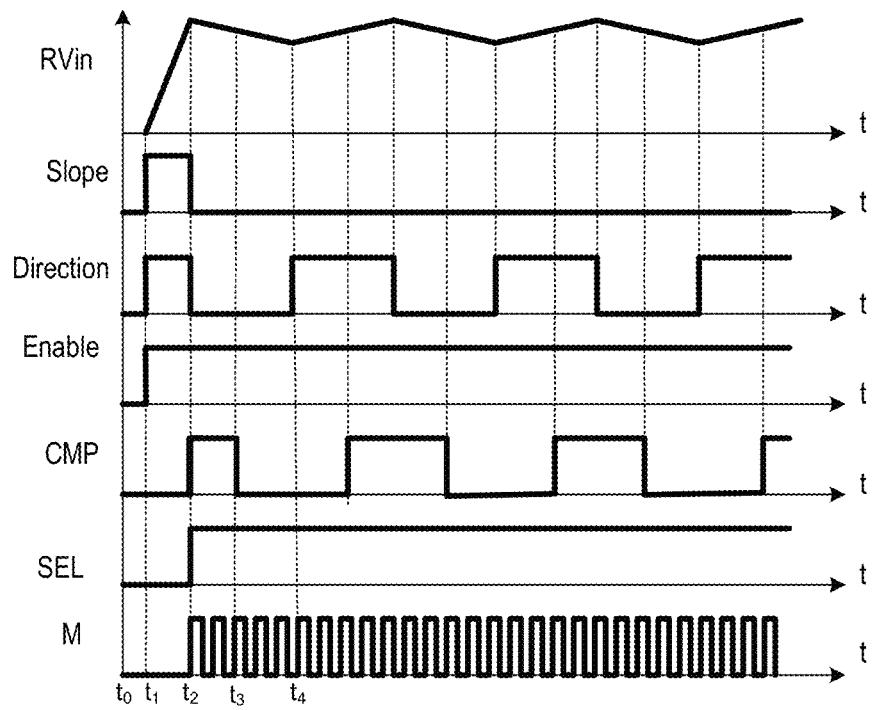
FIG. 4B illustrates a waveform diagram illustrating the operation of a test system associated with the ADC depicted in FIG. 4A.

In some embodiments, the relationship between comparator decision bias and input noise can be further decorrelated by forcing comparator output decisions according to a pattern, as shown with respect to the embodiment of FIGS. 4A and 4B. ADC system 400 illustrated in FIG. 4A, which includes ADC 402 coupled to test logic 404, ramp generator 204 and multiplexer 206, is similar to ADC system 200 illustrated in FIG. 2A, with the exception that the output of comparator 108 is modified to have a particular pattern. In the illustrated embodiment, a multiplexer 406 is coupled between the output of comparator 108 and the input of internal ADC circuitry 106. During normal operation of the ADC 402, the output of comparator 108 is operatively coupled to the input of internal ADC circuits 106. However, during testing, the output M of test logic 404 is applied to the input of internal ADC circuits 106. In some embodiments, signal M may comprise a predetermined pattern in which the number of high logic levels is substantially equal to the number of low logic levels. For example the predetermined pattern might be a periodic pattern that changes state after every N samples, where N=>1. For example, the pattern could change state after every sample (e.g. 10101010 . . . ) or after every few samples (e.g. 1111000011110000 . . . ). In alternative embodiments, other patterns could be used including random patterns, pseudorandom patterns and other deterministic patterns. In some embodiments the embodiment ramp trajectory described above with respect to FIG. 3C (e.g. freezing the output of ramp generator 204) could be used in when comparator output decisions are forced according to a pattern, since applying the pattern serves to decorrelate the relationship between comparator decision bias and the input noise.

FIG. 4B illustrates a waveform diagram that illustrates the operation of ADC system during linearity testing with respect to output RVin of ramp generator 204, ramp generator control signals ENABLE, SLOPE and DIRECTION, output CMP of comparator 108, test multiplexer select signal SEL, and test input M. At time $t_1$, ramp generator is enabled to output a positive ramp with a fast slope by asserting control signal ENABLE that activates ramp generator 204, by setting control signal DIRECTION that configures ramp generator 204 to have a positive output slope and setting SLOPE that configures ramp generator 204 to have a fast slope. At time $t_2$, output CMP of comparator 108 changes state due to the increasing input voltage to ADC 402. In response, control signal SLOPE changes to a low state, which decreases the output slope of ramp generator 204, and control signal DIRECTION changes to a low state that changes the direction of the ramp output signal of ramp generator 204 from an increasing ramp to a decreasing ramp. In addition, the test multiplexer select signal SEL is asserted, which routes test signal M to the input of internal ADC circuitry 106, and a pattern is applied to test signal M. In the illustrated embodiment an alternating 1-0 pattern is shown for test signal M; however, it should be understood that alternative patters could also be used.

At time $t_3$, output CMP of comparator 108 transitions from a high state to a low state due to the decreasing input voltage to ADC 402. In response, test logic 404 causes control signal DIRECTION to transition to a HIGH state at time $t_4$ in order cause signal RVin to be in close proximity of the threshold of comparator 108. In the illustrated embodiment, output signal RVin of ramp generator 204 is controlled in a closed-loop manner using a "bang-bang" or hysteresis control scheme. Hysteresis may be applied by monitoring the output code of ADC 402 and/or may be applied by configuring comparator 402 to have hysteresis. In other words, test logic 404 controls the voltage RVin by decreasing voltage RVin in response to comparator 108 indicating that the voltage RVin has exceeded the threshold and by increasing voltage RVin in response to comparator 108 indicating that voltage RVin has decreased below the threshold.

It should be understood that FIG. 4B illustrates a portion of a test for a single comparator threshold. In any of the embodiments disclosed herein, multiple thresholds could be tested by ramping signal RVin to a first threshold voltage using a fast ramp, performing a linearity test at the first threshold voltage using a slow ramp, and then ramping signal RVin to subsequent threshold voltages and performing a linearity test at each of the subsequent threshold voltages using the slow ramp.

Figure 5A:
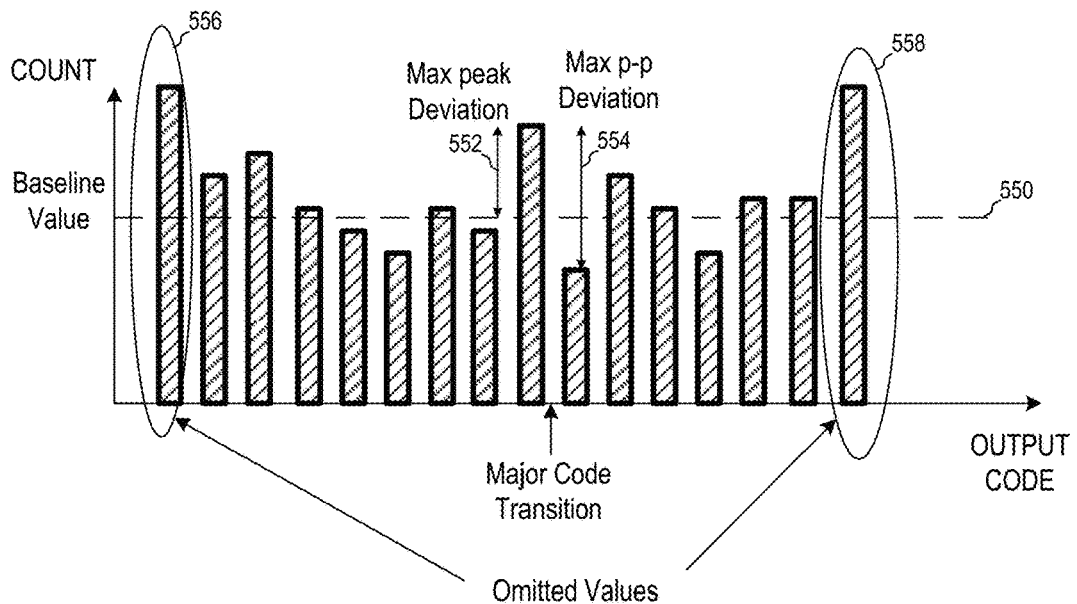
FIG. 5A illustrates an ADC output code histogram according to an embodiment.
Figure 5B:
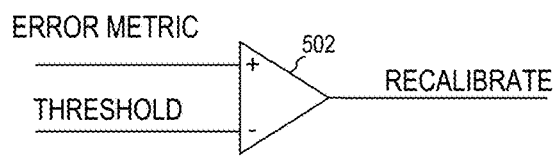
FIGS. 5B and 5C illustrate schematics of test logic implementations according to embodiments.
Figure 5C:
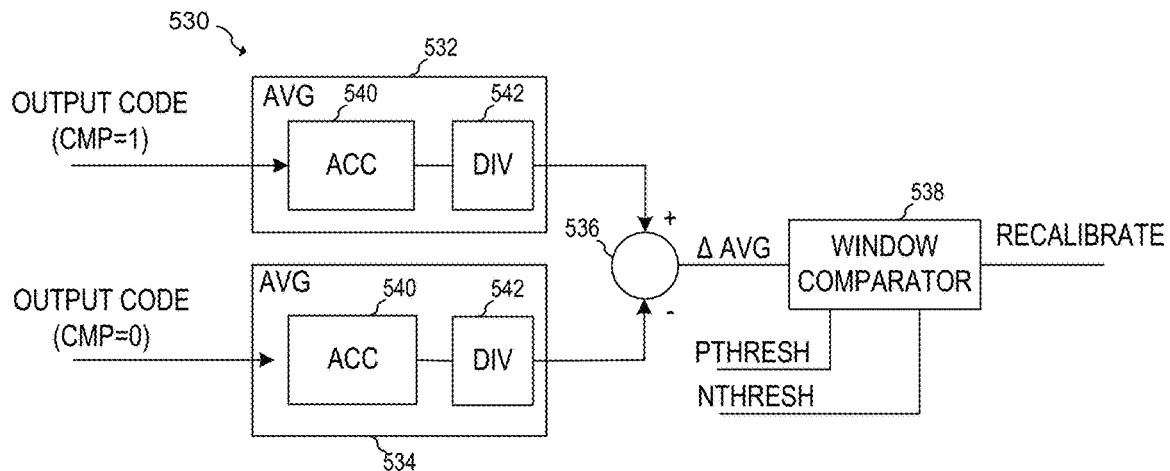

FIGS. 5A-5C illustrate methods of analyzing ADC data gathered during linearity testing according to embodiments of the present invention. This analysis may be used to indicate an occurrence of a non-linearity in a transfer characteristic of the ADC associated with the trip point of the comparator, or a level of a non-linearity in the transfer characteristic of the ADC associated with the trip point of the comparator. In some embodiments, the code density or statistical information related to particular output codes of the ADC are analyzed to determine the linearity of the ADC in the vicinity of the comparator trip point. This code density may be analyzed using various mathematical and statistical methods. Code density analysis is generally applied to embodiments in which the slow ramp portion of the testing cycle traverses an input range corresponding to between about 20 and about 40 ADC output codes, such as the embodiment illustrated in FIG. 3A. However, embodiments having input ranges above and below these number of ADC output codes may also use code density analysis depending on the particular system and its specifications. During the slow ramp portion of the test, a number of samples are collected. The actual number of samples collected may depend on the desired test resolution and the number of output codes traversed by signal RV in. For example, more samples may be collected in systems having larger accuracy requirements test range than in systems having less stringent accuracy requirements. In one specific embodiment, about 640 samples are collect for an output code range of 10 codes to achieve about 64 samples per code. Of course, greater or fewer samples could be collected depending on the particular embodiment and its specifications.

In some embodiments, test logic 202 or 404 forms a histogram describing the relative frequency of each output code. An example of this is shown in FIG. 5A that illustrates a histogram of output code count with respect to output code. Such a histogram may be formed, for example, by logging received ADC output codes in a first set of registers or memory locations, and incrementing count values in a second set of registers or memory locations associated with the first set. Essentially, test logic 202 and 404 is configured to count the number of "hits" for each output code over the time the test signal having a low slope is applied to the ADC.

Once the histogram has been compiled, test logic 202 or 404 may compare the code distribution represented by the histogram with an expected code distribution, e.g. a uniform code distribution. Deviation from an expected code deviation may be indicative of code "jumps" in the ADC. If the measured code distribution differs from the expected distribution by a predetermined amount, test logic 202 or 404 may provide an indication that the ADC is out of calibration. This indication may be used as a trigger to initiate a new calibration cycle. This histogram may be evaluated and/or quantified by test logic 202 or 404 in a number of different ways.

In some embodiments, the shape of the histogram can also be used to determine whether or not the ADC is calibrated. This determination may be achieved by analyzing the histogram to derive an ADC performance metric, and then comparing the derived performance metric with an expected value, an expected range of values, or a threshold. For example, in embodiments in which the ADC output codes are expected to have a uniform distribution (such as would be the case with a linear ramp input) the difference (or the squared difference) between the size of each histogram bin (e.g. the number of counted "hits") could be compared with an expected size of each histogram bin and the difference compared to a predetermined threshold. In the example of FIG. 5A, the expected number of hits is represented by a dashed line 550 representing a baseline value, which may be determined by computing an average count of the logged ADC output codes, or may be a predetermined value. For example, on many situations baseline value 550 is not known a priori and is calculated from the histogram. For example, if 1000 hits were distributed over 10 bins (after eliminating outliner bins 556 and 558), baseline value 500 would be 100. As shown, the count of some output codes exceed the baseline value 550, while the count of other output codes are less than baseline value 550. In one embodiment, a maximum peak deviation 552 between the count of a particular output code and the baseline value may be determined by test logic 202 or 404 and the value compared to a predetermined threshold. In another embodiment, the maximum peak-to-peak deviation 554 may be determined and compared to a predetermined threshold. This peak-to-peak deviation 554 may be evaluated with respect to adjacent codes and/or may be evaluated with respect to all codes. The evaluation of peak-to-peak deviations of adjacent codes may provide an indication of DNL. In some cases, this maximum peak-to-peak deviation may occur at a major code transition of the ADC.

In other embodiments, an error metric that takes into account the deviation of all logged output codes may also be used, For example, the peak or peak-to-peak deviation of each histogram bin could be computed and summed to provide an error metric. In some cases, a squaring or other function could be applied to each individual deviation to derive a mean-squared error, root-mean-square error, or other metric.

In some embodiments, one or more minimum 556 and maximum 558 logged ADC output codes or histogram entries may be omitted from the code density analysis in order to retain only codes that are undisturbed by these "edge effects" that occur when the slope of the waveform generated by ramp generator 204 changes direction.

In various embodiments, the ADC performance metric determined from the code density analysis is compared to a threshold to provide an indication as to whether or not the ADC is adequately calibrated. In such an embodiment, the error metric can be compared to a threshold using a comparator, such as digital comparator 502 as illustrated in FIG. 5B.

In some embodiments, the linearity of the ADC may be determined by performing a code comparison of the output code of the ADC in the region of the comparator threshold. This can be achieved, for example, by comparing the codes produced by the ADC when the output of comparator 108 is in a first state to the codes produced by the ADC when the output of comparator 108 is in a second state. Code comparison analysis is generally applied to embodiments in which the slow ramp portion of the testing cycle traverses a small input range, such as described above with respect to the embodiment of FIG. 3B, or embodiments in which the input signal is static during linearity analysis, such as described above with respect to the embodiment of FIG. 3C. Counting of codes for comparing is provided over the time that the respective test signal portion (slow ramp/static signal) is applied to the input of the ADC. Code comparison analysis could also be applied to the embodiment of FIG. 3A instead of, or in addition to code density analysis depending on the specific system and its specifications. This particular embodiment is well-suited to ADCs having an error correcting or redundant architecture (also referred to as a "redundant ADC"), such as an error correcting pipelined ADC or a redundant SAR ADC in which the input signals near the trip point of comparator 108 are mapped to the same output code regardless of the output of comparator 108.

In an embodiment, collected ADC output codes may be averaged or accumulated according to the output CMP of comparator 108, as shown in FIG. 5D showing calculation unit 530. Calculation unit 530 includes averaging circuit 532 that is configured to average output codes when the output of comparator 108 is in a first state (e.g. CMP=1), and averaging circuit 534 that is configured to accumulate output codes when the output of comparator 108 is in a second state (e.g. CMP=0). At the end of a test cycle for a particular threshold, a difference ΔAVG between the output of averaging circuit 532 and the output of averaging circuit 534 is computed by subtractor 536. A window comparator 538 determines whether difference ΔAVG falls between thresholds PTHRESH and NTHRESH. If the difference ΔAVG falls outside of this window, signal RECALIBRATE is asserted indicated that the ADC is out of calibration.

In an embodiment, averaging circuits 532 and 534 is implemented using an accumulator 540 that is configured to accumulate the ADC output code when the output of comparator 108 is in its respective predetermined state followed by a divider 542 that is configured to divide the output of accumulator 540 by the number of accumulated samples to form an average. In some cases, divider 542 may be omitted and the linearity evaluation may be based on the difference between the outputs of the accumulators. In such embodiments, the number of counts taken for each comparator state may be fixed. In addition, thresholds PTHRESH and NTHRESH may be scaled according the number of count taken for each comparator. In embodiments in which the number of counts is a power of 2, dividers 542 could be implemented using a shifter to right shift or left shift the output of accumulator 540 according to the divisor. Accumulator 540, divider 542, subtractor 536 and window comparator may be implemented using digital logic circuits known in the art.

While the embodiment of FIG. 5C is directed to evaluating ADC output codes according to comparator output states (e.g. CMP=1 or CMP=0), it should be understood that histograms and accumulated values could also be collected with respect to comparator output patterns (e.g., CMP 1→0 or 0→1 output transitions). It should also be appreciated that the embodiments of FIGS. 5A-5D represent a few specific examples of the many possible ways in which the output codes of the ADC may be processed to determine linearity of an ADC according to embodiments of the present invention.

Figure 6A:
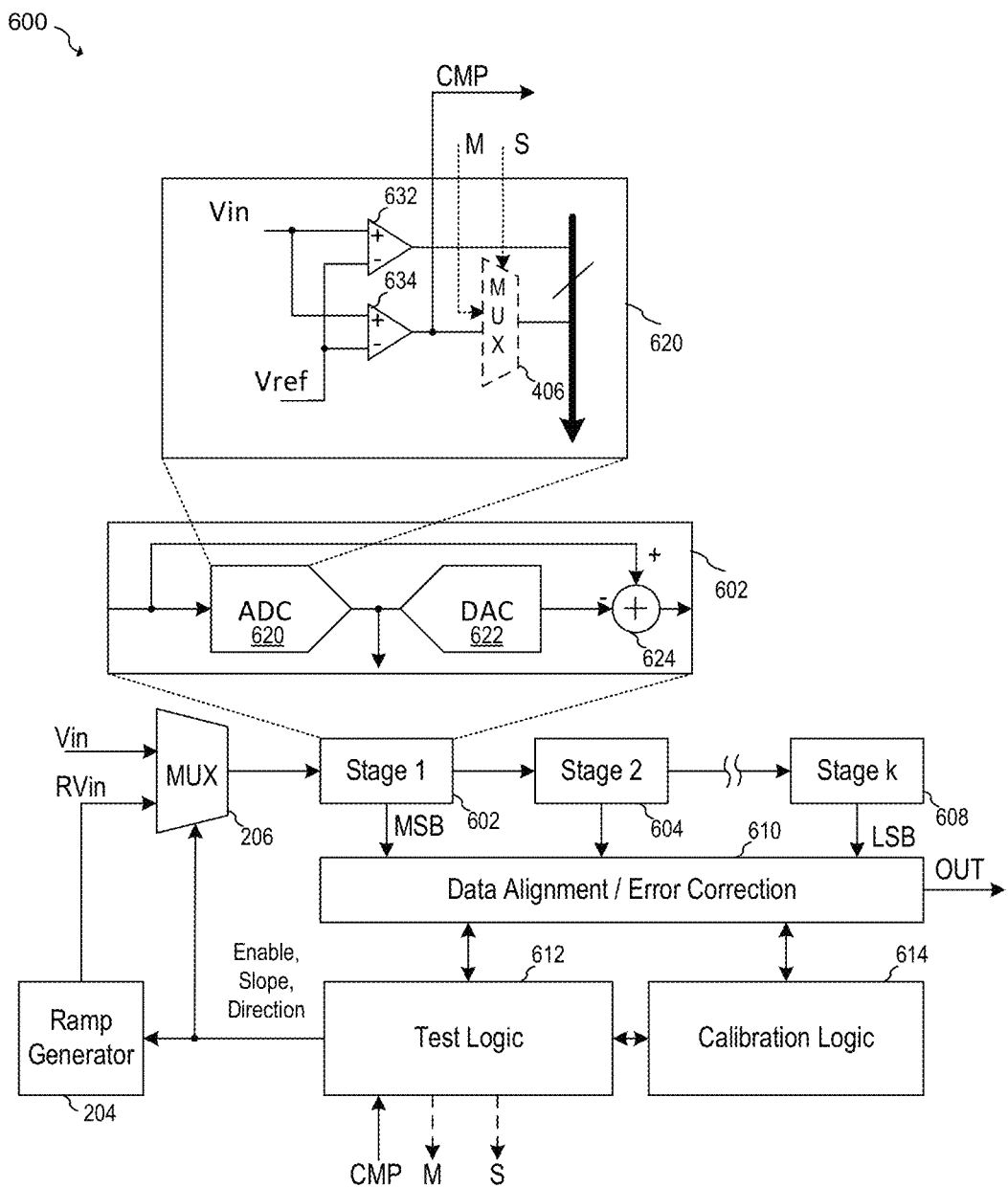
FIG. 6A illustrates a pipelined ADC according to an embodiment.
Figure 6B:
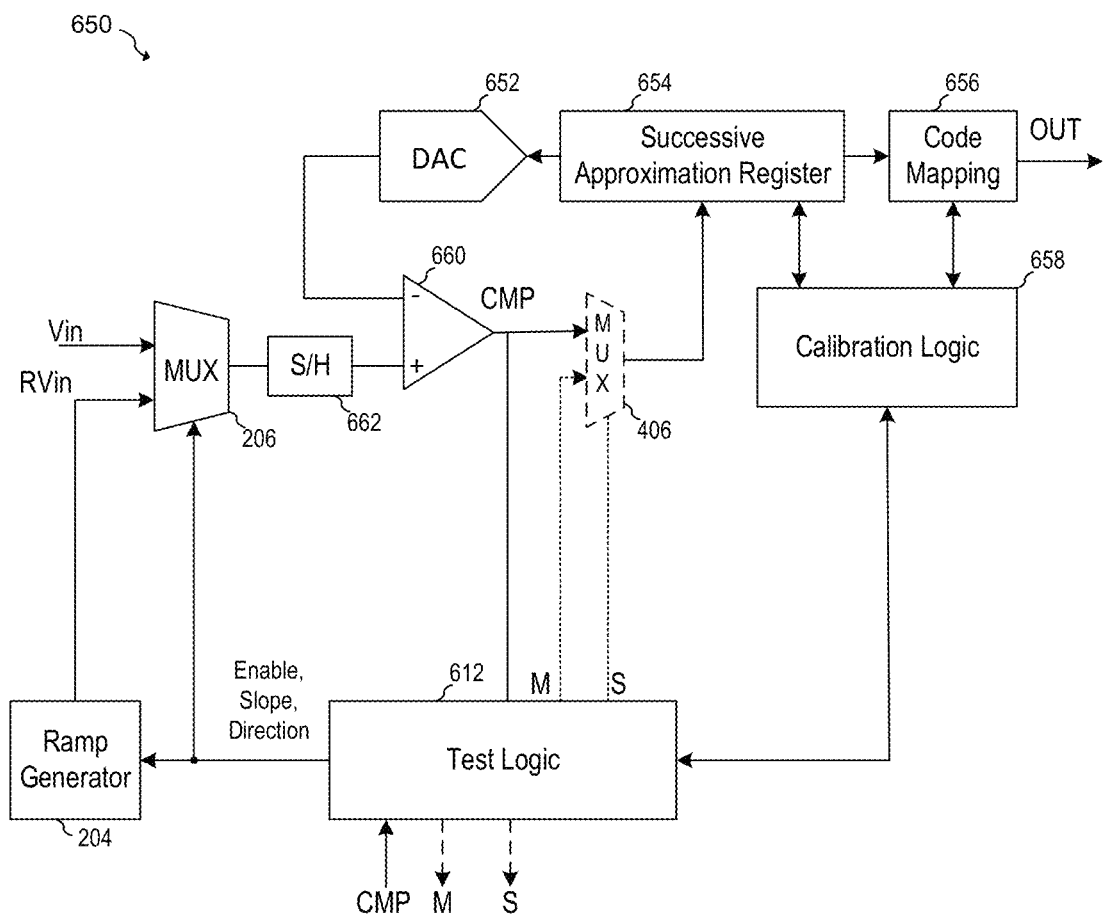
FIG. 6B illustrates a successive approximation ADC according to an embodiment.

FIGS. 6A and 6B illustrate two example ADC systems configured to utilize linearity testing systems and methods according to embodiments of the present invention. FIG. 6A is directed to a pipelined ADC system, and FIG. 6B is directed to a successive approximation ADC system. Pipelined ADC system 600 shown in FIG. 6A includes a total of k pipeline stages 602, 604 and 608. The first pipeline stage includes an ADC 620, a DAC 622 and a subtractor 624. During operation, first pipeline stage 602 converts input voltage Vin to a digital value MSB representing the one or more most significant bits of the conversion. DAC 622 converts the converted value back into the analog domain, and subtractor 624 subtracts the DAC output from the analog input to form a residue signal. This residue signal is passed to the next pipeline stage 604, which amplifies the residue signal and forms a further digital output and a further residue signal in a similar manner as pipeline state 602. In some embodiments, the residue amplification is performed prior to passing the residue to the next stage using, for example, a multiplying DAC (MDAC). Each respective residue is processed in a similar manner by each of the first k−1 stages to form a plurality of digital outputs and a final reside, which is digitized by the kth stage to yield digital value LSB representing one or more least significant bits of the conversion. In various embodiments, one or more pipelined stages may have a redundant bit range to facilitate pipelined ADC error correction methods known in the art. In the illustrated embodiment, ADC 620 of the first pipeline stage 602 performs a 1.5-bit conversion using two comparators 632 and 634 instead of a single comparator, which provides an extra 0.5 bit of redundancy over and above a single bit.

Data alignment and error correction circuit 610 receives the results of each partial conversion from each pipeline stage 602, 604 and 608 and forms an ADC output code OUT passed on these partial conversions. Data alignment and error correction circuit 610 may be implemented using data alignment and error correction known in the art. For example, in some embodiments, data alignment and error correction circuit 610 may form a weighted average of each partial conversion to form the final output value. In some embodiments, calibration logic 614 performs a foreground calibration of ADC system 600 using foreground calibration techniques known in the art. In some embodiments, calibration logic 614 performs a digital foreground calibration that adjusts the weighting applied to the partial conversion of each stage. In alternative embodiments, calibration logic 614 may facilitate an analog foreground calibration in which the gains and/or threshold levels of one or more pipeline stages 602, 604 and/or 608 are adjusted.

In various embodiments, test logic 612 and ramp generator 204 perform a linearity test of ADC system 600 according to embodiment methods described above with respect to FIGS. 2A-2B, 3A-3C, 4A-4B and 5A-5D. In some embodiments, test logic 612 may be implemented and function in a similar manner as test logic 202 shown in FIG. 2A. For example, test logic 612 may monitor the output of one or more comparators disposed within the ADCs of one or more pipeline stages 602, 604 and 608. While the illustrated embodiment of FIG. 6A shows test logic 612 monitoring the output of a single comparator 634 disposed within ADC 620 of first pipeline stage 602, it should be understood that test logic 612 may also be configured to monitor comparator 632 and/or may be configured to monitor comparators in other stages. In configurations in which ADC 620 has greater than two comparators, test logic 612 could be configured to monitor the additional comparators as well. In such embodiments, test logic 612 may serially perform a plurality of linearity tests that correspond to the input voltage level of each individual comparator. In between each linearity test, test logic 612 may cause ramp generator 204 to increase ramping signal RVin to the next input signal level (corresponding to the next comparator being tested) using a fast slope as described above in order to decrease the total test time of all input signal levels corresponding to all test comparator threshold levels.

In some embodiments, test logic 612 may be implemented in a similar manner as test logic 404 shown in FIG. 4A in which a test signal M is substituted for the output of the monitored comparator. Such embodiments may utilize multiplexer 406 coupled to the output of comparator 634 and to test outputs M and SEL produced by test logic 612 as described above with respect to the embodiment of FIGS. 4A and 4B. Multiplexer 406 and signals M and S produced by test logic 612 are shown in dashed line to indicate that this is an optional feature.

Successive approximation register (SAR) ADC system 650 shown in FIG. 6B is configured to perform a successive approximation of input voltage Vin. During operation, input voltage Vin is sampled by sample and hold circuit 662. Over a plurality of successive approximation cycles, successive approximation register 654 provides a digital input to DAC 652, and the output of DAC 652 is compared to the sampled input voltage produced by sample and hold circuit 662. At the end of each successive approximation cycle, the content of the successive approximation register 654 is updated based on the output of comparator 660. DAC 652 may be implemented using various DAC architectures known in the art. In one example, DAC 652 may be implemented using a charge redistribution switched capacitor array that also incorporates the function of sample and hold circuit 662. In such embodiments, input voltage Vin may be sampled on the bottom plates of the capacitor array, while the DAC function is implemented by redistributing charge on the top plates of capacitors of the capacitor array, as is known in the art.

In one example embodiment, the successive approximation is initialized with a word in which the MSB is set high and the remaining bits are set low (e.g. 100 ... 00) in order to produce a half scale output. If the DAC voltage is greater than the sampled input voltage, comparator 660 produces a "0" output, and the successive approximation register is updated such that the MSB is set low, the next most significant bit is set high, and the remaining bits are set low (e.g. 010 ... 00) in order to produce a quarter scale output. On the other hand, if the DAC voltage is less than the sampled input voltage, comparator 660 produces a "1" output, and the successive approximation register is updated such that the MSB is set high, the next most significant bit is set high, and the remaining bits are set low (e.g. 110 ... 00) in order to produce a three-quarter scale output. Subsequent successive approximation cycles are performed in a similar manner until each bit is tested and the resulting contents of the successive approximation register represents a digitized value of the sampled input.

In some embodiments, DAC 652 may be a redundant DAC having a sub-binary radix. In such embodiments, errors produced by comparator offsets and/or capacitor mismatch made in earlier successive approximation cycles are correctable during later approximation cycles using redundant SAR ADC techniques known in the art. In such embodiments, code-mapping circuit 656 may be used to translate the non-binary output of successive approximation register 654 into a binary word, for example, by performing a weighted sum of the each bit of successive approximation register 654. In some embodiments, calibration logic 658 may be used to calibrate the linearity of SAR ADC system 650 using foreground calibration techniques known in the art. Foreground calibration techniques and/or redundant SAR ADC systems and method described in U.S. Pat. No. 4,970,514, may be applied to embodiments of the present invention. In some embodiments, calibration logic 658 performs a digital foreground calibration that adjusts the weighting applied by code mapping circuit 656 to the output of successive approximation register 654. In alternative embodiments, calibration logic 658 may facilitate an analog foreground calibration in which the elements of DAC 652 are adjusted.

In various embodiments, test logic 612 and ramp generator 204 perform a linearity test of SAR ADC system 650 according to embodiment methods described above with respect to FIGS. 2A-2B, 3A-3C, 4A-4B and 5A-5D. In some embodiments, test logic 612 may be implemented and function in a similar manner as test logic 202 shown in FIG. 2A. For example, test logic 612 may monitor the output of comparator 660 as shown. In some embodiments, test logic monitors the output CMP of comparator 660 during a predetermined successive approximation cycle. Test logic 612 may monitor the output of comparator 660 during the first approximation cycles for comparisons corresponding to a half-scale DAC value, and may monitor the output of comparator 660 during the second successive approximation cycle for comparisons corresponding to a quarter-scale or three-quarter-scale DAC values or other DAC values associated with major code transitions. A non-binary radix DAC might differ from these values.

While the illustrated embodiment of FIG. 6B shows test logic 612 monitoring the output of a single comparator 660 disposed within SAR ADC system 650, it should be appreciated that test logic 612 may also be configured to monitor multiple comparators in embodiments in which a multi-level comparison is made. In embodiments in which SAR ADC system 650 has two or more comparators (not shown), test logic 612 could be configured to monitor these additional comparators as well.

Test logic 612 may be configured to test multiple comparisons performed during different successive approximation cycles. In such embodiments, test logic 612 is configured to serially perform a plurality linearity tests at input voltages that correspond to different DAC output levels during the same or different successive approximation cycles. Between each linearity test, test logic 612 may cause ramp generator 204 to increase ramping signal RVin to the next input signal level (corresponding to the next DAC level being tested) using a fast slope as described above in order to decrease the total test time.

In some embodiments, test logic 612 may be implemented in a similar manner as test logic 404 shown in FIG. 4A in which a test signal M is substituted for the output of the monitored comparator. Such embodiments may utilize multiplexer 406 coupled to the output of comparator 66o and to test outputs M and SEL produced by test logic 612 as described above with respect to the embodiment of FIGS. 4A and 4B. Multiplexer 406 and signals M and S produced by test logic 612 are shown in dashed lined to indicate that the inclusion of multiplexer 406 is optional.

Figure 7A:
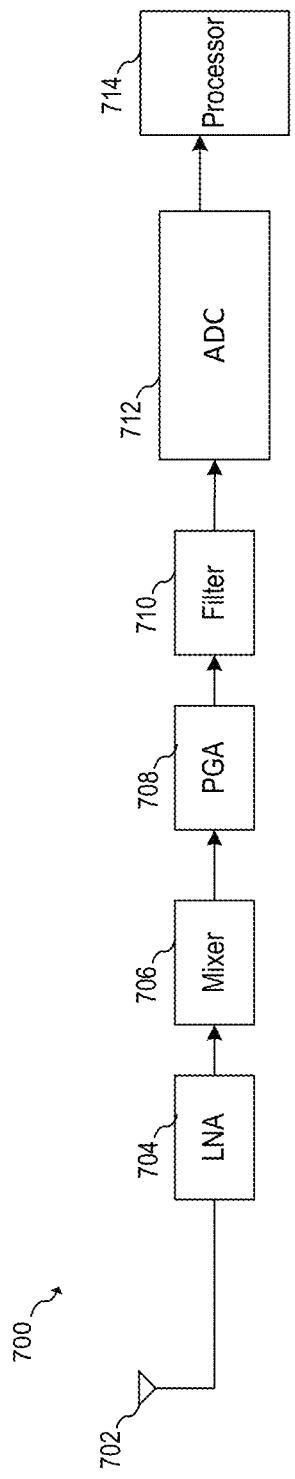
FIG. 7A illustrates a radio frequency receiver that utilizes an ADC linearity test system according to an embodiment.

ADCs incorporating embodiment test systems and methods may be applied to a wide variety of different systems and applications. One example of such a system is a radio frequency receiver, such as radio frequency receiver 700 illustrated in FIG. 7A. As shown, radio frequency receiver 700 includes an RF signal path having antenna 702, low noise amplifier 704, mixer 706, programmable gain amplifier 708, filter 710, embodiment ADC 712, and processor 714. During operation, a radio frequency signal received by antenna 702 is amplified by low noise amplifier 704. Mixer 706 performs a downconversion that translates the frequency of the received radio frequency signal to an intermediate frequency or to a baseband frequency. The output of mixer 706 is amplified by programmable gain amplifier 708, and the output of programmable gain amplifier 708 is filtered by filter 710. The filtering provided by filter 710 may be used to reject out of band frequency content and/or serve as an anti-aliasing filter for ADC 712 that includes an ADC with associated test circuitry such as embodiment test controller and ramp generator as described above with respect to FIGS. 2A, 2B, 3A and 3B. In some embodiments, ADC 712 also includes calibration circuitry as discussed above with respect to FIGS. 1A, 1B, 2A, 4A, 6A and 6B. ADC 712 may be implemented, for example using a pipelined ADC, an SAR ADC, or other ADC architecture known in the art. The ADC architecture may include redundancy. Processor 714 may perform signal processing on the output of ADC 712. It should be understood, however, that the architecture of radio frequency receiver 700 illustrated in FIG. 7A is just one example of many possible radio frequency receiver implementations that may be implemented using ADCs that utilize embodiment test systems and methods.

In various embodiments, radio frequency receiver 700 may be used in a wide variety of radio frequency-based systems. For example, radio frequency receiver 700 may be used as the receive signal path for a cellular telephone, or other wireless device. Radio frequency receiver 700 may also be used, for example, in a radar system. Embodiment test systems and methods are particularly well suited for use in radar systems that utilize periodic radar signals, such as frequency modulated continuous wave (FMCW) radar systems. In such embodiments, a radar transceiver emits a series of increasing or decreasing frequency. The radar receiver, in turn, receives reflections of the transmitted radar chips and determines a frequency difference between the reflected signal and the signal currently being transmitted. This frequency difference is proportional the distance between the radar transceiver and the detected target.

Figure 7B:
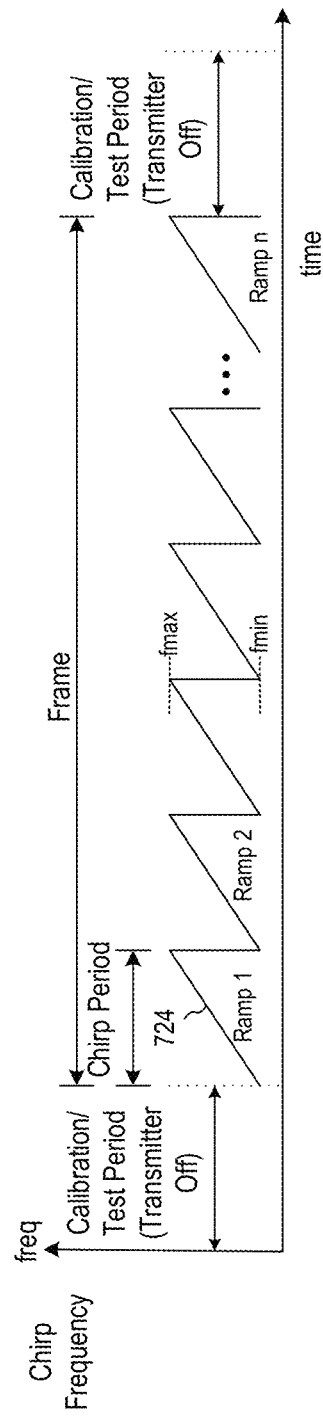
FIG. 7B illustrates a diagram illustrating how linearity test and calibration are scheduled within a radar frame according to an embodiment.

In embodiments of the present invention, a calibration and/or a linearity test may be performed during time periods in between chirps as shown in the waveform diagram of FIG. 7B, which illustrates a relationship between embodiment calibration and test periods and an FMCW radar frame. As shown, the FMCW radar frame includes n chirp periods in which the chirp frequency 724 increases in a linear fashion between a minimum frequency fmin and a maximum frequency fmax. Once chirp frequency 724 reaches maximum frequency fmax at the end of the chirp period, chirp frequency 724 is reset to minimum frequency fmin. While FIG. 7B shows chirps of increasing frequency, it should be understood that in some embodiments chirp frequency 724 may linearly decrease from maximum frequency fmax at the beginning of each chirp period to minimum frequency fmin at the end of each chirp period. In other embodiments, chirp periods in which chirp frequency 724 linearly increases alternate with chirp periods in which chirp period of chirp frequency 724 linearly decreases. In other embodiments, various frequencies, chirp periods and frame lengths may be used depending on the specific embodiment and its specifications.

As shown in the example of FIG. 7B, ADC 712 is calibrated and/or tested between each frame according to test and calibration methods described above with respect to FIGS. 1A, 1B, 2A, 4A, 6A and 6B. While FIG. 7B shows test and/or calibration occurring before and after a single radar frame as an illustrative example, it should be understood that the ADC 712 could be calibrated and/or tested after any number of consecutive radar frames. It should be further understood that the system examples of FIGS. 7A and 7B are just non-limiting examples showing how embodiment ADC test and calibration system and methods could be incorporated in practical system applications.

In some embodiments, the various ADC systems described herein may be disposed on a single monolithic semiconductor integrated circuit, such as a single semiconductor substrate, and/or on the same monolithic semiconductor integrated circuit as other disclosed system components.

Figure 8:
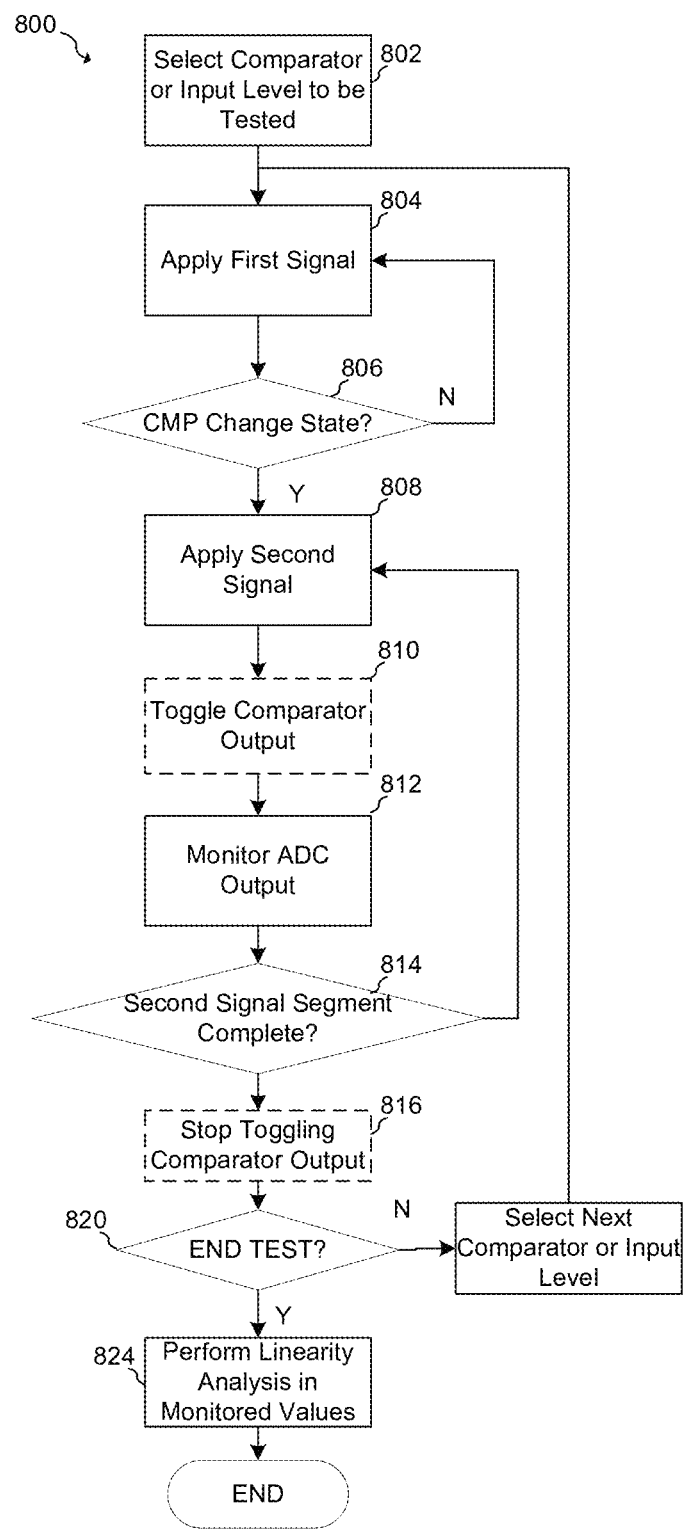
FIG. 8 illustrates a block diagram of a method according to an embodiment.

FIG. 8 illustrates a block diagram of an embodiment method 800 of performing a linearity test on an ADC. The tested ADC and the testing system configured to perform the test may correspond to one of the embodiments described herein in FIGS. 2A-2B, 3A-3C, 4A-4B, 5A-5C, 6A-6B and 7A-7B. In step 800, a comparator associated with a comparator trip point or an input level for testing is selected. Next, in steps 804 to 816 a linearity test is performed in accordance with the embodiments disclosed above for the selected comparator or input level. In step 804 a first signal is applied to the input to input of the ADC in order to quickly attain an input level associated with the selected input level associated with the comparator trip point. In various embodiments, the first signal is a ramp signal having a first slope, and the output of the selected comparator is monitored while the first signal is applied to the ADC. In some embodiments the first signal may be generated by ramp generator 204 as described in embodiments above.

When the system detects that the monitored selected comparator changes state in step 806, a second signal is applied to the input of the ADC in step 808. In various embodiments, the initial value of the second signal level is equivalent to the most recent value of the first signal level. The second signal may include a static signal as described above with respect to FIG. 3C or may include at least one ramp segment in at least one direction as described above with respect to FIGS. 3A and 3B. In some embodiments, a switching pattern is applied to the logical output of the comparator in step 810 as described above with respect to the embodiment of FIG. 4B such that the logical output of the comparator begins to toggle. The code output of the ADC is monitored in step 812 while the second signal is applied until the second signal segment is determined to be complete in step 814. In various embodiments, the second signal is applied for a predetermined period of time and/or for a period of time long enough to gather enough data points to determine the linearity of the ADC for an input range associated with the selected input level. The length of time may depend on the desired test resolution, the characteristics of the second signal, and the type of post processing used to determine the ADC performance metric.

In step 820, a determination is made regarding whether or not there are any remaining input test points. If so, the next comparator or input level is selected and steps 804-816 are repeated for the next test point. In some embodiments, ramp generator 204 ramps the input signal of the ADC from the signal level associated with previously selected comparator trip point to the signal level associated with the next selected comparator trip point. Once all test points are evaluated, as determined in step 820, the linearity of the ADC is determined according to the algorithms described above with respect to FIGS. 5A-5C. In some embodiments, the linearity of the ADC is determined on a point by point basis for each test prior to step 820. The linearity results of all test points may be evaluated during step 824 to determine whether the overall linearity of the ADC meets predefined performance criteria (or a predefined performance criterion). In some embodiments, this predefined performance criteria may be as simple as ensuring that all measured test points meet a predefined ADC performance metric. Alternatively, the results of each individual test point may be weighted and summed together to obtain an overall ADC performance metric.

Figure 9:
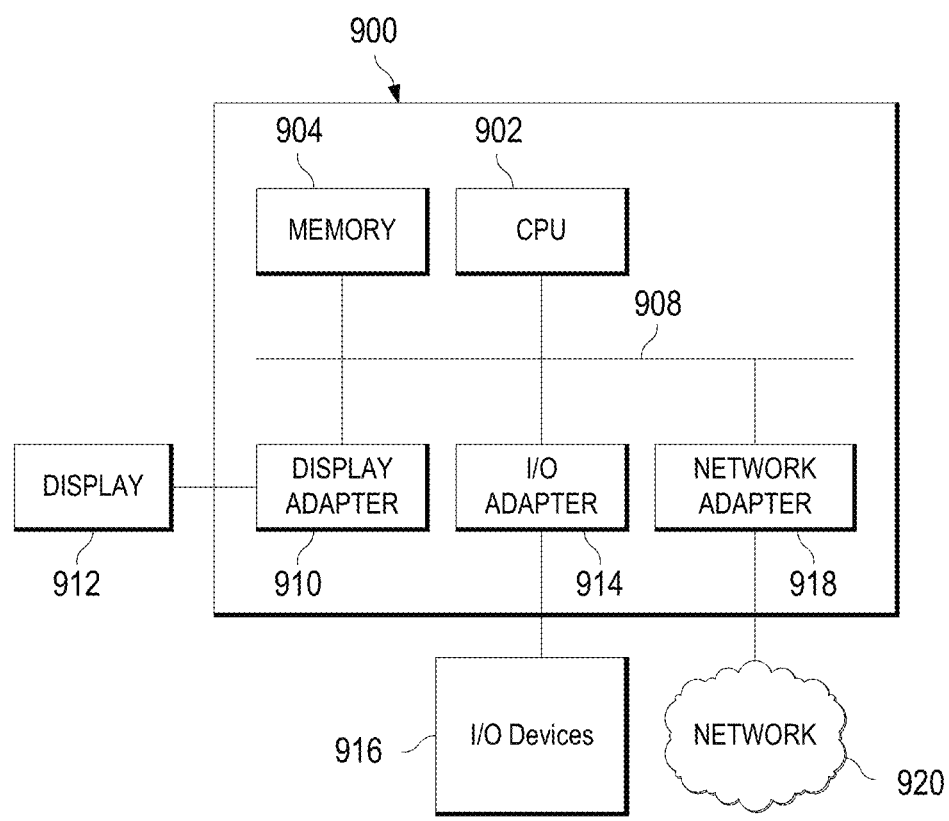
FIG. 9 illustrates a block diagram of a processing system that can be used to implement portions of embodiment linearity testing systems.

Referring now to FIG. 9, a block diagram of a processing system 900 is provided in accordance with an embodiment of the present invention. The processing system 900 depicts a general-purpose platform and the general components and functionality that may be used to implement portions of the embodiment radar system and/or an external computer or processing device interfaced to the embodiment radar system. For example, processing system 900 may be used to implement some or all of the processing performed by the test logic and foreground calibration logic disclosed in the embodiments above, and may be used to track and post-process ADC output codes in order to determine an ADC performance metric, as described, for example, with respect to FIGS. 5A-5C.

Processing system 900 may include, for example, a central processing unit (CPU) 902, and memory 904 connected to a bus 908, and may be configured to perform the processes discussed above according to programmed instructions stored in memory 904 or on other non-transitory computer readable media. The processing system 900 may further include, if desired or needed, a display adapter 910 to provide connectivity to a local display 912 and an input-output (I/O) Adapter 914 to provide an input/output interface for one or more input/output devices 916, such as a mouse, a keyboard, flash drive or the like.

The processing system 900 may also include a network interface 918, which may be implemented using a network adaptor configured to be coupled to a wired link, such as a network cable, USB interface, or the like, and/or a wireless/cellular link for communications with a network 920. The network interface 918 may also comprise a suitable receiver and transmitter for wireless communications. It should be noted that the processing system 900 may include other components. For example, the processing system 900 may include hardware components power supplies, cables, a motherboard, removable storage media, cases, and the like if implemented externally. These other components, although not shown, are considered part of the processing system 900. In some embodiments, processing system 900 may be implemented on a single monolithic semiconductor integrated circuit and/or on the same monolithic semiconductor integrated circuit as other disclosed system components.

Embodiments of the present invention are summarized here. Other embodiments can also be understood from the entirety of the specification and the claims filed herein.

Example 1. A method for operating an analog-to-digital converter (ADC) including a comparator, the method including: determining a trip point of the comparator by applying a first signal having a first slope to an input of the ADC, and monitoring an output state of the comparator in response to the first signal; and after applying the first signal, applying a second signal having a second signal level based on the determined trip point of the comparator, monitoring values of an output code of the ADC in response to the second signal, and generating statistical information based on the monitored values of the output code, where the second signal is a static signal or has as second slope less than the first slope.

Example 2. The method of example 1, further including analyzing the statistical information to determine at least one of an occurrence of a non-linearity in a transfer characteristic of the ADC associated with the trip point of the comparator; or a level of a non-linearity in the transfer characteristic of the ADC associated with the trip point of the comparator.

Example 3. The method of one of examples 1 or 2, further including performing a first calibration of the ADC before determining the trip point of the comparator, analyzing the statistical information, selectively performing a second calibration based on whether the statistical information meets predetermined criteria, and repeating applying the second signal, monitoring the values of the output code of the ADC and generating the statistical information.

Example 4. The method of example 3, where the first and second calibrations are foreground calibrations.

Example 5. The method of example 3 or 4, where performing the second calibration includes providing second calibration data in response to the second calibration and replacing first calibration data associated with the first calibration of the ADC before determining the trip point with the second calibration data, the method further including: scheduling the second calibration based on a signal load of the ADC.

Example 6. The method of example 3 or 4, where performing the second calibration includes providing second calibration data in response to the second calibration and selectively replacing first calibration data associated with the first calibration of the ADC before determining the trip point with the second calibration data based on whether the statistical information meet a predetermined criterion.

Example 7. The method of example 6, where the predetermined criteria is based on a level of a jump.

Example 8. The method of one of examples 1 to 7, where the second signal has the second slope less than the first slope, and where the statistical information includes information indicating a histogram of the monitored values of the output code.

Example 9. The method of example 8, where applying the first signal includes applying the first signal until the output state of the comparator changes in response to the first signal to achieve a first signal level, and then applying the second signal having an initial value of the first signal level.

Example 10. The method of example 8, where applying the second signal further includes alternatingly increasing the second signal level to a first upper level and decreasing the second signal level to a second lower level according to the second slope within a predetermined range that includes the signal level corresponding to the trip point of the comparator.

Example 11. The method of example 10, further including generating the second signal, where generating the second signal includes generating a ramp signal having the second slope in a first direction when increasing the second signal level, and generating the ramp signal having the second slope in a second direction opposite the first direction when decreasing the second signal level.

Example 12. The method of example 10, where generating the information indicating the histogram includes omitting histogram entries of output codes of the ADC associated with the first upper level and the second lower level of the second signal.

Example 13. The method of one of examples 1 to 12, where the statistical information includes first statistical information indicating an average of values of codes resulting from first decisions of the comparator and second statistical information indicating an average of values of codes resulting from second decisions of the comparator, where the method further includes comparing the first statistical information with the second statistical information.

Example 14. The method of example 13, where applying the second signal includes applying a static signal having a signal level based on the determined trip point.

Example 15. The method of example 13, further including generating the first and second statistical information based on compiling a first group of output codes associated with a transition of the output state of the comparator from a first state to a second state, and compiling a second group of output codes associated with a transition of the output state of the comparator from the second state to the first state.

Example 16. The method of example 15, where the first group of output codes is further associated with the second signal level increasing, and the second group of output codes is further associated with the second signal level decreasing.

Example 17. The method of example 15 or 16, where compiling the first group of output codes includes averaging or accumulating values of the first group of output codes, and compiling the second group of output codes includes averaging or accumulating values of the second group of output codes.

Example 18. The method of example 13, further including generating the first statistical information based on averaging or accumulating a first group of output codes when the output state of the comparator has a first state, and generating the second statistical information based on averaging or accumulating a second group of output codes when the output state of the comparator has a second state.

Example 19. The method of example 13, further including alternatingly modifying an output state of the comparator while applying the second signal.

Example 20. The method of one of examples 1 to 19, where the ADC includes a redundant ADC.

Example 21. An integrated circuit including: an analog-to-digital converter (ADC) including at least one comparator disposed on the integrated circuit; a test signal generator disposed on the integrated circuit and having an output selectably coupled to an input of the ADC, the test signal generator configured to produce a ramp signal; and a test controller coupled to an output of the at least one comparator and the test signal generator, the test controller configured to: cause the test signal generator to produce a first ramp signal having a first slope, the first ramp signal causing an output state of the at least one comparator to change at a comparator trip point; cause the test signal generator to produce a second ramp signal having a second slope less than the first slope, where the second ramp signal alternatingly increases and decreases between a first upper level and a second lower level, where the comparator trip point is between the first upper level and second lower level; and evaluating occurrences of individual output codes of the ADC.

Example 22. The integrated circuit of example 21, where the test controller is configured to evaluate occurrences of the individual output codes by counting a number of hits for at least one individual output code.

Example 23. The integrated circuit of example 22, where the test controller is further configured to analyze a distribution of the counted number of hits, to determine an ADC performance metric from the analyzed distribution of the counted number of hits, and to compare the ADC performance metric with a predetermined threshold.

Example 24. The integrated circuit of example 22 or 23, where the test controller is further configured to compare the counted number of hits with an expected number of hits.

Example 25. The integrated circuit of one of examples 21 to 24, further including a calibration circuit coupled to the ADC and disposed on the integrated circuit, where the test controller is configured to test the ADC after the calibration circuit calibrates the ADC.

Example 26. The integrated circuit of example 25, where the calibration circuit is configured to calibrate the ADC based on whether or not the evaluated occurrences of the individual ADC output codes meet predefined criteria.

Example 27. An integrated circuit including: an analog-to-digital converter (ADC) including at least one comparator disposed on the integrated circuit; a test signal generator having an output coupled to an input to an ADC; and a test controller having an output coupled to the test signal generator, a first input coupled to an output of a comparator of the ADC, and a second input configured to receive an output code of the ADC, where the test controller is configured to determine a trip point of the comparator by causing the test signal generator to apply a first signal having a first slope to an input of the ADC, and monitoring an output state of the comparator in response to the first signal, and cause the test signal generator to apply a second signal having a signal level based on the determined trip point of the comparator, and comparing an accumulation or average of values of codes resulting from first decisions of the comparator with an accumulation or average of values of codes resulting from second decisions of the comparator, where the second signal is a static signal or has as second slope less than the first slope.

Example 28. The integrated circuit of example 27, where the test controller further includes an output coupled to the comparator, and the test controller is further configured to modify the output state of the at least one comparator according to a pattern.

Example 29. The integrated circuit of one of examples 27 or 28, where the ADC includes a redundant ADC.

Example 30. The integrated circuit of example 26, where the redundant ADC is a pipelined ADC, and where the at least one comparator is disposed within a pipeline stage of the pipeline ADC.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for operating an analog-to-digital converter (ADC) comprising a comparator, the method comprising:
   determining a trip point of the comparator by applying a first signal having a first slope to an input of the ADC, and monitoring an output state of the comparator in response to the first signal; and
   after applying the first signal, applying a second signal having a second signal level based on the determined trip point of the comparator, monitoring values of an output code of the ADC in response to the second signal, and generating statistical information based on the monitored values of the output code, wherein the second signal is a static signal or has as second slope less than the first slope.

2. The method of claim 1, further comprising analyzing the statistical information to determine at least one of
   an occurrence of a non-linearity in a transfer characteristic of the ADC associated with the trip point of the comparator; or
   a level of the non-linearity in the transfer characteristic of the ADC associated with the trip point of the comparator.

3. The method of claim 1, further comprising performing a first calibration of the ADC before determining the trip point of the comparator, analyzing the statistical information, selectively performing a second calibration based on whether the statistical information meets predetermined criteria, and repeating applying the second signal, monitoring the values of the output code of the ADC and generating the statistical information.

4. The method of claim 3, wherein the first and second calibrations are foreground calibrations.

5. The method of claim 3, wherein performing the second calibration comprises providing second calibration data in response to the second calibration and replacing first calibration data associated with the first calibration of the ADC before determining the trip point with the second calibration data, the method further comprising: scheduling the second calibration based on a signal load of the ADC.

6. The method of claim 3, wherein performing the second calibration comprises providing second calibration data in response to the second calibration and selectively replacing first calibration data associated with the first calibration of the ADC before determining the trip point with the second calibration data based on whether the statistical information meet a predetermined criterion.

7. The method of claim 6, wherein the predetermined criteria is based on a level of a jump.

8. The method of claim 1, wherein the second signal has the second slope less than the first slope, and wherein the statistical information comprises information indicating a histogram of the monitored values of the output code.

9. The method of claim 8, wherein applying the first signal comprises applying the first signal until the output state of the comparator changes in response to the first signal to achieve a first signal level, and then applying the second signal having an initial value of the first signal level.

10. The method of claim 8, wherein applying the second signal further comprises alternatingly increasing the second signal level to a first upper level and decreasing the second signal level to a second lower level according to the second slope within a predetermined range that includes the signal level corresponding to the trip point of the comparator.

11. The method of claim 10, further including generating the second signal, wherein generating the second signal comprises generating a ramp signal having the second slope in a first direction when increasing the second signal level, and generating the ramp signal having the second slope in a second direction opposite the first direction when decreasing the second signal level.

12. The method of claim 10, wherein generating the information indicating the histogram comprises omitting histogram entries of output codes of the ADC associated with the first upper level and the second lower level of the second signal.

13. The method of claim 1, wherein the statistical information comprises first statistical information indicating an average of values of codes resulting from first decisions of the comparator and second statistical information indicating an average of values of codes resulting from second decisions of the comparator, wherein the method further comprises comparing the first statistical information with the second statistical information.

14. The method of claim 13, wherein applying the second signal comprises applying the static signal, wherein the static signal has a signal level based on the determined trip point.

15. The method of claim 13, further comprising generating the first and second statistical information based on compiling a first group of output codes associated with a transition of the output state of the comparator from a first state to a second state, and compiling a second group of output codes associated with a transition of the output state of the comparator from the second state to the first state.

16. The method of claim 15, wherein the first group of output codes is further associated with the second signal level increasing, and the second group of output codes is further associated with the second signal level decreasing.

17. The method of claim 15, wherein compiling the first group of output codes comprises averaging or accumulating values of the first group of output codes, and compiling the second group of output codes comprises averaging or accumulating values of the second group of output codes.

18. The method of claim 13, further comprising generating the first statistical information based on averaging or accumulating a first group of output codes when the output state of the comparator has a first state, and generating the second statistical information based on averaging or accumulating a second group of output codes when the output state of the comparator has a second state.

19. The method of claim 13, further comprising alternatingly modifying the output state of the comparator while applying the second signal.

20. The method of claim 13, wherein the ADC comprises a redundant ADC.

21. An integrated circuit comprising:
an analog-to-digital converter (ADC) comprising at least one comparator disposed on the integrated circuit;
a test signal generator disposed on the integrated circuit and having an output selectably coupled to an input of the ADC, the test signal generator configured to produce a ramp signal; and
a test controller coupled to an output of the at least one comparator and the test signal generator, the test controller configured to:
cause the test signal generator to produce a first ramp signal having a first slope, the first ramp signal causing an output state of the at least one comparator to change at a comparator trip point;
cause the test signal generator to produce a second ramp signal having a second slope less than the first slope, wherein the second ramp signal alternatingly increases and decreases between a first upper level and a second lower level, wherein the comparator trip point is between the first upper level and second lower level; and
evaluating occurrences of individual output codes of the ADC.

22. The integrated circuit of claim 21, wherein the test controller is configured to evaluate occurrences of the individual output codes by counting a number of hits for at least one individual output code.

23. The integrated circuit of claim 22, wherein the test controller is further configured to analyze a distribution of the counted number of hits, to determine an ADC performance metric from the analyzed distribution of the counted number of hits, and to compare the ADC performance metric with a predetermined threshold.

24. The integrated circuit of claim 22, wherein the test controller is further configured to compare the counted number of hits with an expected number of hits.

25. The integrated circuit of claim 21, further comprising a calibration circuit coupled to the ADC and disposed on the integrated circuit, wherein the test controller is configured to test the ADC after the calibration circuit calibrates the ADC.

26. The integrated circuit of claim 25, wherein the calibration circuit is configured to calibrate the ADC based on whether or not the evaluated occurrences of the individual ADC output codes meet predefined criteria.

27. An integrated circuit comprising:
an analog-to-digital converter (ADC) comprising at least one comparator disposed on the integrated circuit;
a test signal generator having an output coupled to an input to an ADC; and
a test controller having an output coupled to the test signal generator, a first input coupled to an output of a comparator of the ADC, and a second input configured to receive an output code of the ADC, wherein the test controller is configured to
determine a trip point of the comparator by causing the test signal generator to apply a first signal having a first slope to an input of the ADC, and monitoring an output state of the comparator in response to the first signal, and
cause the test signal generator to apply a second signal having a signal level based on the determined trip point of the comparator, and comparing an accumulation or average of values of codes resulting from first decisions of the comparator with an accumulation or average of values of codes resulting from second decisions of the comparator, wherein the second signal is a static signal or has as second slope less than the first slope.

28. The integrated circuit of claim 27, wherein the test controller further comprises an output coupled to the comparator, and the test controller is further configured to modify the output state of the at least one comparator according to a pattern.

29. The integrated circuit of claim 27, wherein the ADC comprises a redundant ADC.

30. The integrated circuit of claim 29, wherein the redundant ADC is a pipelined ADC, and wherein the at least one comparator is disposed within a pipeline stage of the pipeline ADC.

* * * * *